(12) United States Patent
Durth et al.

(10) Patent No.: US 10,074,973 B2
(45) Date of Patent: Sep. 11, 2018

(54) OVERVOLTAGE PROTECTION APPARATUS WITH MONITORING FUNCTION

(71) Applicant: PHOENIX CONTACT GMBH & CO. KG, Blomberg (DE)

(72) Inventors: Rainer Durth, Horn-Bad Meinberg (DE); Steffen Pfortner, Springe (DE)

(73) Assignee: PHOENIX CONTACT GMBH & CO. KG (DE)

( * ) Notice: Subject to any disclaimer, the term of this patent is extended or adjusted under 35 U.S.C. 154(b) by 0 days.

(21) Appl. No.: 15/508,624

(22) PCT Filed: Oct. 1, 2015

(86) PCT No.: PCT/EP2015/072680
§ 371 (c)(1),
(2) Date: Mar. 3, 2017

(87) PCT Pub. No.: WO2016/050907
PCT Pub. Date: Apr. 7, 2016

(65) Prior Publication Data
US 2017/0279269 A1   Sep. 28, 2017

(30) Foreign Application Priority Data
Oct. 1, 2014   (DE) .......................... 10 2014 219 913

(51) Int. Cl.
*H02H 9/04*   (2006.01)
*H02H 1/00*   (2006.01)
(Continued)

(52) U.S. Cl.
CPC ......... *H02H 9/042* (2013.01); *G01R 31/1236* (2013.01); *H01C 7/12* (2013.01); *H02H 1/0007* (2013.01); *H02H 9/06* (2013.01)

(58) Field of Classification Search
CPC ........ H02H 9/042; H02H 9/06; H02H 1/0007; G01R 31/1236; H01C 7/12
See application file for complete search history.

(56) References Cited

U.S. PATENT DOCUMENTS 3,742,419 A   6/1973   Martzloff
4,912,590 A * 3/1990   Misencik ............... H02H 9/042
                                                    361/111

(Continued)

FOREIGN PATENT DOCUMENTS

DE        34 23 444 A1   9/1985
DE   10 2011 109 007 A1   1/2013
(Continued)

OTHER PUBLICATIONS

International Search Report prepared by the European Patent Office on Jan. 11, 2016, for International Application No. PCT/EP2015/072680.

(Continued)

*Primary Examiner* — Scott Bauer
(74) *Attorney, Agent, or Firm* — Sheridan Ross P.C.

(57) ABSTRACT

The object of the invention is an overvoltage protection apparatus with monitoring function having a parallel circuit of two branch circuits, wherein the first branch circuit has a first overvoltage protection device and a second overvoltage protection device that are connected in series, wherein the second branch circuit has a third device and a fourth device that are connected in series, wherein the first overvoltage device and the third device have a first shared voltage potential during operation, and wherein the second overvoltage device and the fourth device have a second shared voltage potential during operation, wherein a first measuring tap is provided between the first overvoltage protection device and the second overvoltage protection device and wherein a second measuring tap is provided between the third device and the fourth device, with a signal being derived from the voltage between the first measuring tap and the second measuring tap that provides state information in (Continued)

relation to the first overvoltage protection device and the second overvoltage protection device.

9 Claims, 4 Drawing Sheets

(51) Int. Cl.
*H02H 9/06* (2006.01)
*H01C 7/12* (2006.01)
*G01R 31/12* (2006.01)

(56) References Cited

U.S. PATENT DOCUMENTS

| | | |
|---|---|---|
| 5,621,309 A | 4/1997 | Feldman |
| 5,864,454 A * | 1/1999 | Zaretsky ............... H02H 9/042 |
| | | 361/127 |
| 6,477,025 B1 | 11/2002 | Goldbach et al. |
| 2015/0022932 A1* | 1/2015 | Hasenoehrl ............ H02G 13/60 |
| | | 361/124 |

FOREIGN PATENT DOCUMENTS

| | | |
|---|---|---|
| DE | 10 2012 022 399 A1 | 5/2014 |
| FR | 2 893 196 A1 | 5/2007 |

OTHER PUBLICATIONS

Search Report prepared by the German Patent Office on May 26, 2015 for German Patent Application No. 10 2014 219 913.1.

* cited by examiner

OVERVOLTAGE PROTECTION APPARATUS WITH MONITORING FUNCTION

CROSS REFERENCE TO RELATED APPLICATIONS

This application is a national stage application under 35 U.S.C. 371 and claims the benefit of PCT Application No. PCT/EP2015/072680 having an international filing date of 1 Oct. 2015, which designated the United States, which PCT application claimed the benefit of German Patent Application No. 10 2014 219 913.1 filed 1 Oct. 2014, the disclosure of each of which are incorporated herein by reference.

The invention relates to an overvoltage protection apparatus with monitoring function.

Overvoltage protection apparatuses make use of varistors or transient voltage suppressor diodes (TVS diodes).

Varistors are used in overvoltage protection to limit electrical surges, for example. The range of performance extends from measurement and control loops with small signals to applications in the high-voltage range. It is known that varistors are subject to aging, which is greatly dependent on the installation conditions and the frequency and intensity of loads with overvoltage pulses, for which reason the aging behavior of varistors cannot be reliably predicted.

Transient voltage suppressor diodes (TVS diodes) are used to limit overvoltage particularly in the area of measurement and control technology, in information technology (IT), and generally in lower-voltage circuits, i.e., typically in an area that is referred to as secondary or fine protection. It is known that TVS diodes, when overloaded (e.g., by high peak current amplitudes), are damaged in a number of different ways. Besides so-called "short-circuiting," damage also occurs in which the diodes remain in a relatively high impedance state, even to the point that the junction capacitance of the diode is changed to a relevant extent.

In order to address this problem, isolating arrestors are typically provided in varistors that isolate the respective varistor. These isolating arrestors utilize heat of the varistor to isolate the varistor upon reaching a temperature predetermined by the manufacturer.

TVS diodes, in contrast, are only rarely monitored, much less separated by isolating arrestors from the electrical circuit in the event of a fault. Thermal isolating arrestors for monitoring TVS diodes are already known from DE 10 2010 038 066 and DE 10 2010 036 909. These isolating arrestors are also based on the principle of component heating. In order for these to function, however, the already-flowing "leakage current" must already be at a certain level in order to cause the necessary heating of the component.

Particularly in measurement and control technology and IT applications with (very) low-power systems, the power (of the flowing leakage current) can be insufficient in some cases to ensure reliable disconnection.

In other solutions (Raycap, for example), the varistors are provided with massive housings in which the overloaded varistor can be short-circuited and destroyed without consequences for the surroundings. In other words, a switch-off is dispensed with and the destruction accepted. Especially pressure- and temperature-resistant housings must be made available for this purpose, which are both bulky in size and expensive.

Thermal disconnection mechanisms react to the energy conversion (increase in temperature) that results from fault currents/leakage currents. Depending on the degree of damage, the leakage current can rise very quickly.

However, how fast the thermal isolating arrestors respond depends on a multitude of factors. As a rule, one critical factor is the thermal mass, which every mechanical isolating arrestor has. The mechanism must generally be designed to be relatively massive, since it must be capable of bearing the targeted surge currents and, if triggered, must have stored sufficient mechanical energy in order to reliably move the break contacts. Compounding the difficulty is the fact that the critical area of a varistor in which the unacceptable heating occurs (so-called hot spot) is sometimes farther removed from the thermal isolating arrestors, so that the heat transfer to the point of disconnection is poor.

Severely delayed responses on the part of the thermal isolating arrestors can occur as a result. Thus, there is the risk of the varistor or a TVS diode being damaged more quickly than the thermal isolating arrestor(s) can react. In this case, the danger exists that the isolating arrestor will no longer disconnect the leakage current, which can develop into a short-circuit current on the network. This can lead to the complete, explosive destruction of the varistor or of the TVS diode.

Systems that do not monitor the thermal aging of the active overvoltage protection elements, but instead only monitor the effect of the short-circuit current through the arrester by means of massive metallic housings, are comparatively large and have strong repercussions on the network, including the potential for triggering system fuses.

Another drawback of the known monitoring methods is that it is not the current damage of the varistors or diodes themselves that is detected; rather, it is only the consequence of damage that is detected and the consequences of total failure that are reduced. The monitoring of the temperature therefore makes use of a secondary, time-delayed effect that only manifests itself when the damage has already advanced substantially and an immediate danger therefore exists.

The anticipatory identification of damage to varistors and TVS diodes by metrological means involves considerable time and effort, because, as a rule, the component, more particularly the overvoltage protection component, must be separated from the supply network so that its electrical parameters can be measured and compared with established threshold values.

This is laborious for one thing; for another, it is also associated, as a rule, with an interruption of the supply voltage to the device to be protected.

It is the object of the invention to provide an overvoltage protection apparatus with monitoring function that avoids one or more drawbacks of the prior art.

The object is achieved according to the invention by the features of the independent claims. Advantageous embodiments of the invention are indicated in the subclaims.

In the following, the invention is explained in further detail with reference to the enclosed drawing on the basis of preferred embodiments.

The figures show an overvoltage protection apparatus with monitoring function 1.

The overvoltage protection apparatus with monitoring function 1 has a parallel circuit of two branch circuits A, B. The first branch circuit A has a first overvoltage protection device $Ü_1$ and a second overvoltage protection device $Ü_2$, which are connected in series. Even though varistors are generally depicted in the figures as an overvoltage protection device, this is not limitative and is to be regarded merely as an example of overvoltage protection devices of the general type.

Furthermore, the second branch circuit B has a third device $E_3$ and a fourth device $E_4$, which are also connected in series.

During operation, the first overvoltage device $Ü_1$ and the third device $E_3$ have a first shared voltage potential $P_1$, whereas the second overvoltage device $Ü_2$ and the fourth device $E_4$ have a second shared voltage potential $P_2$ during operation. A first measuring tap $M_1$ is provided between the first overvoltage protection device $Ü_1$ and the second overvoltage protection device $Ü_2$, and a second measuring tap $M_2$ is provided between the third device $E_3$ and the fourth device $E_4$, with a signal $S_1$, $S_2$ being derived from the voltage between the first measuring tap $M_1$ and the second measuring tap $M_2$ that makes state information available in relation to the first overvoltage protection device $Ü_1$ and the second overvoltage protection device $Ü_2$.

Figure 1:
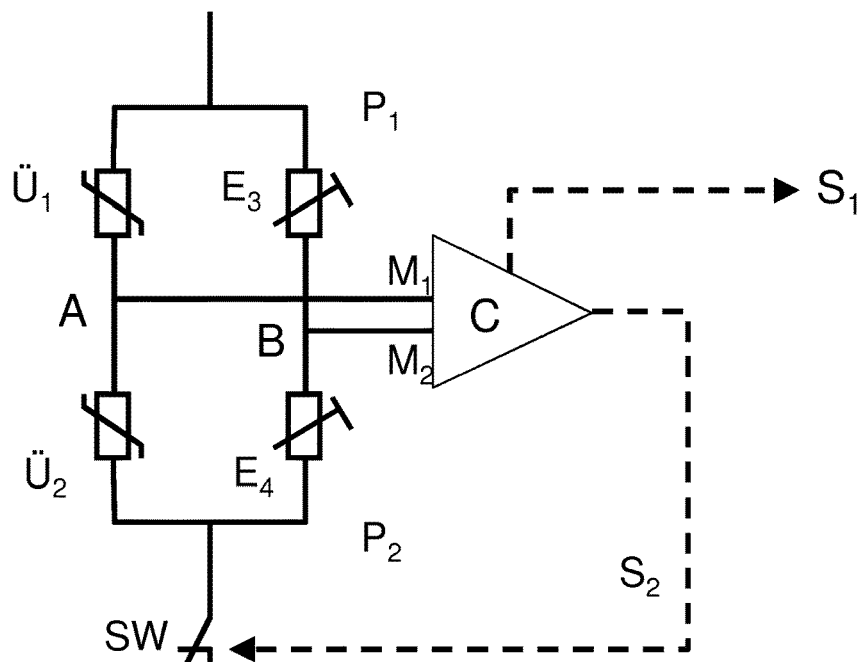
FIG. 1 shows a first block diagram of an apparatus according to the invention according to a first embodiment.
Figure 2:
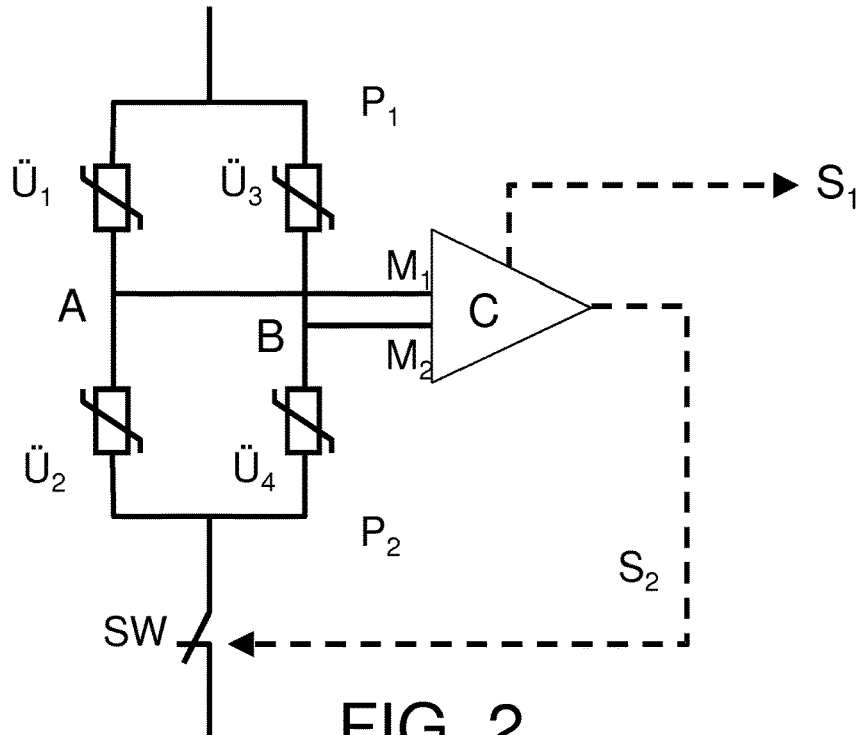
FIG. 2 shows a second block diagram of an apparatus according to the invention according to a second embodiment.
Figure 5:
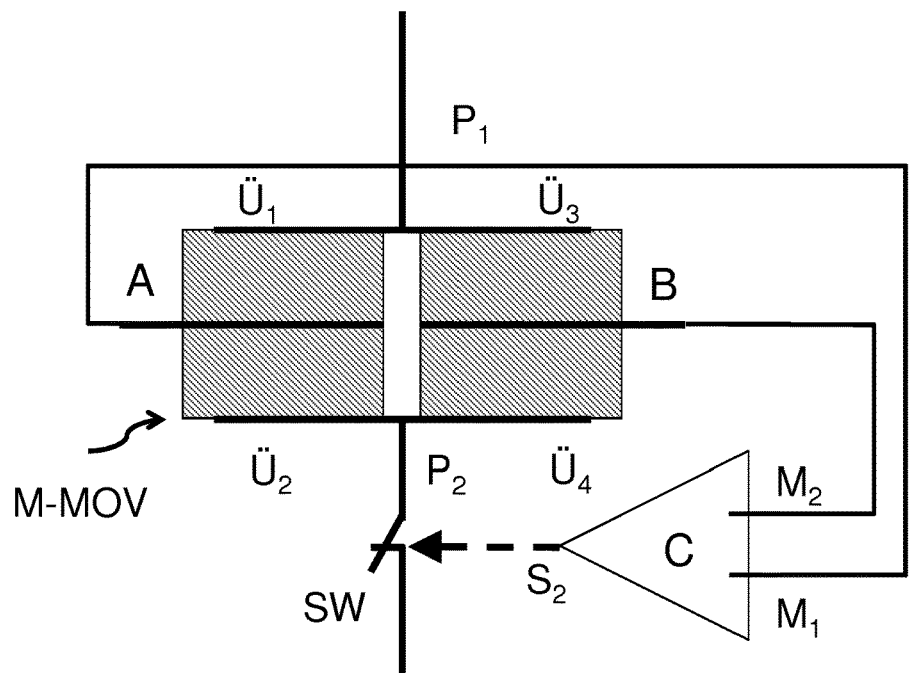
FIG. 5 shows the use of another multi-contact varistor in a circuit according to FIG. 2.
Figure 6:
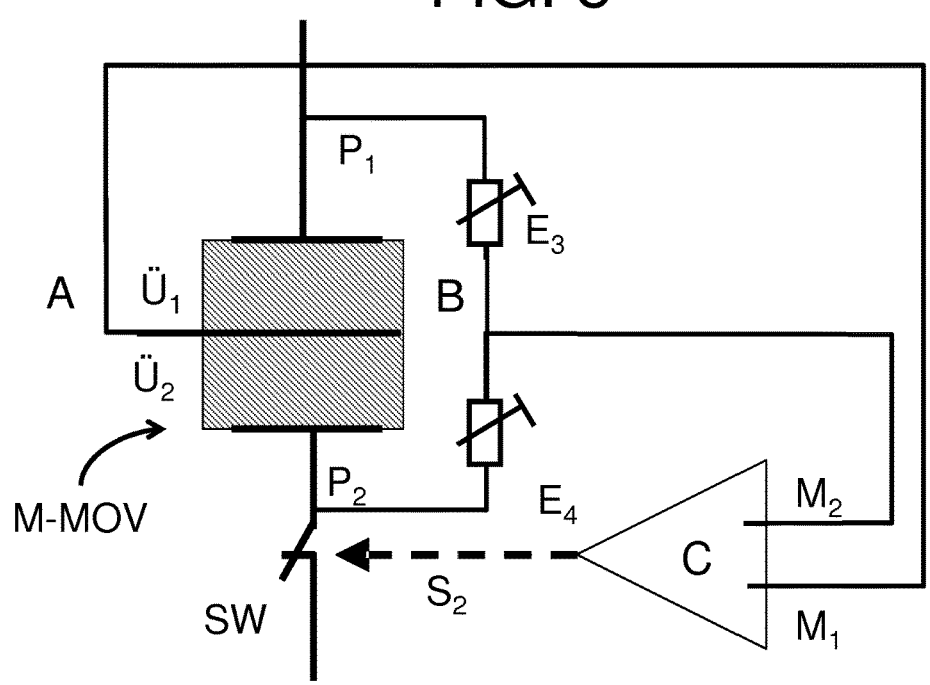
FIG. 6 shows the use of another multi-contact varistor in a circuit according to FIG. 1.
Figure 7:
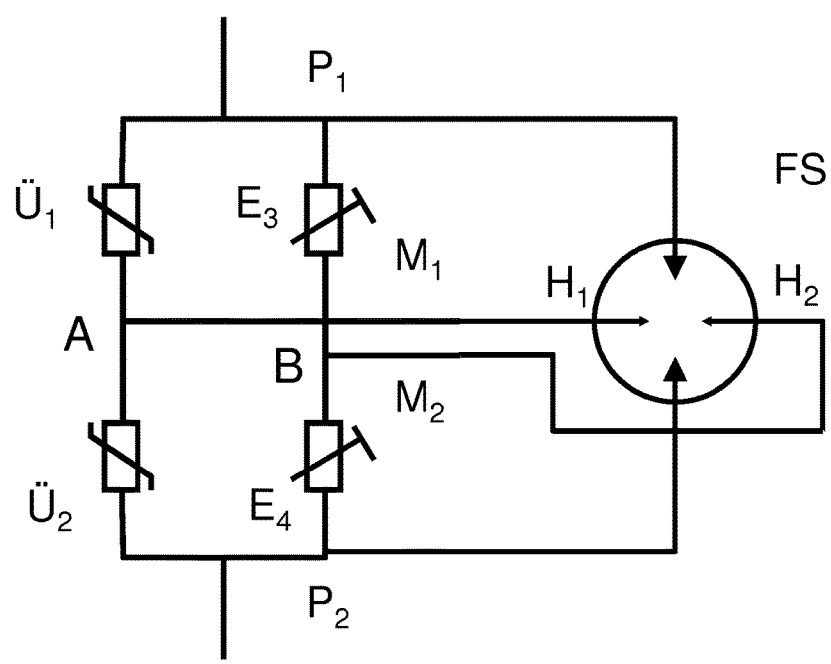
FIG. 7 shows an arrangement with a spark gap and a circuit according to FIG. 1.

As shown in FIG. 1, FIG. 6, and FIG. 7, the third device $E_3$ and the fourth device $E_4$ can, for example, be a series circuit of complex resistances such as capacitors, coils, resistors, or a combination thereof, or the third device $E_3$ and the fourth device $E_4$ are themselves embodied as the third overvoltage protection device $Ü_3$ and fourth overvoltage protection device $Ü_4$, as shown in FIGS. 2-5. Insofar as it is not explicitly indicated below that a specific design must be used exclusively, a description of one design must always be assumed to cover the other design as well.

With the embodiments described above, it is not possible to immediately identify the state of the overvoltage protection devices in a simple manner. To wit, if one of the overvoltage protection devices is damaged, this has an immediate effect on the impedance. Due to the arrangement in a configuration similar to a Wheatstone bridge, a voltage now occurs between measuring taps $M_1$ and $M_2$ due to the altered impedance ratios.

That is, the voltage between the first measuring tap $M_1$ of the branch circuit A and the second measuring tap $M_2$ of the branch circuit B is compared. If one of the components changes, this can be detected very easily on the basis of the change in voltage between the first measuring tap $M_1$ of the branch circuit A and the second measuring tap $M_2$ of the branch circuit B. In some circumstances, it is possible to determine the branch circuit A or B in which the fault occurs from the (sign of the) signal. Since this change can be registered very early on, appropriate measures can be initiated very promptly.

For the status check, a temporary or periodic measurement (such as those performed in power plants) or a continuous measurement can be performed. Both measurements can be carried out during operation with the greatest of ease while the line voltage is connected. In the most general of terms, it can be assumed that a voltage measurement not equal to zero indicates that a defect is present in one of the overvoltage protection devices. With appropriate evaluation and further processing, fault indication signals and switch commands (open or disconnect, etc.) can be generated from the measurements.

In one advantageous embodiment, it is now possible, as shown in FIGS. 1 to 6, for example, to provide an evaluation circuit C, with the evaluation circuit C evaluating a differential mode voltage between the first measuring tap $M_1$ and the second measuring tap $M_2$. Such an evaluation circuit can be constructed by means of an operational amplifier, for example, in which case disconnection is initiated and/or a local or remote signaling $S_1$ is provided when a certain differential voltage is reached, for example. Local signaling can be provided, for example, by means of an optical and/or acoustic signal and/or a local display, e.g., an e-paper display, for status signaling or for the signaling of measurement values. Remote signaling can be provided, for example, in the form of remote reporting of an indication, and/or by means of an automation bus, or generally by means of telecommunication.

The evaluation unit C can be utilized on the basis of different algorithms in order to rule out errors and enable the sensitivity to be adjusted. Different switching and reporting thresholds can easily be generated particularly with varistors, so a low differential voltage that is detected can be taken as an indication of the onset of degradation in one of the overvoltage devices, thus enabling a corresponding component to be replaced during a shift inspection.

It is particularly advantageous that the measurement can be performed during ongoing operation, so that it is not necessary to switch off or remove the overvoltage protection devices.

Moreover, a provision can be made in embodiments of the invention for the derived signal $S_2$ to be used as a switch signal for a shutoff device SW.

For example, the shutoff device can be a contactor or an otherwise suitable switch, or an externally triggerable fuse such as those which have already been invented by the applicant and constitute the subject matter of other applications.

Even though the focus was placed on varistors and transient voltage suppressor diodes in the introduction, the invention is not limited to these; rather, the operating principles can also be used for other suitable overvoltage protection devices $Ü_1$, $Ü_2$. The same applies with respect to the third device $E_3$ and the fourth device $E_4$ in their implementation as overvoltage protection devices $Ü_3$, $Ü_4$.

In one especially compact embodiment, multicontact varistors M-MOV are used, as will now be described below in relation to various embodiments in conjunction with FIGS. 3 to 6.

In these embodiments, for example, the first overvoltage protection device $Ü_1$ and the second overvoltage protection device $Ü_2$ are each embodied as a subvaristor of a multicontact varistor M-MOV, and the first measuring tap $M_1$ is in electrical contact with a (center) contact of the multicontact varistor M-MOV. Although the subvaristors are depicted as being identical, this is not absolutely necessary.

Figure 3:
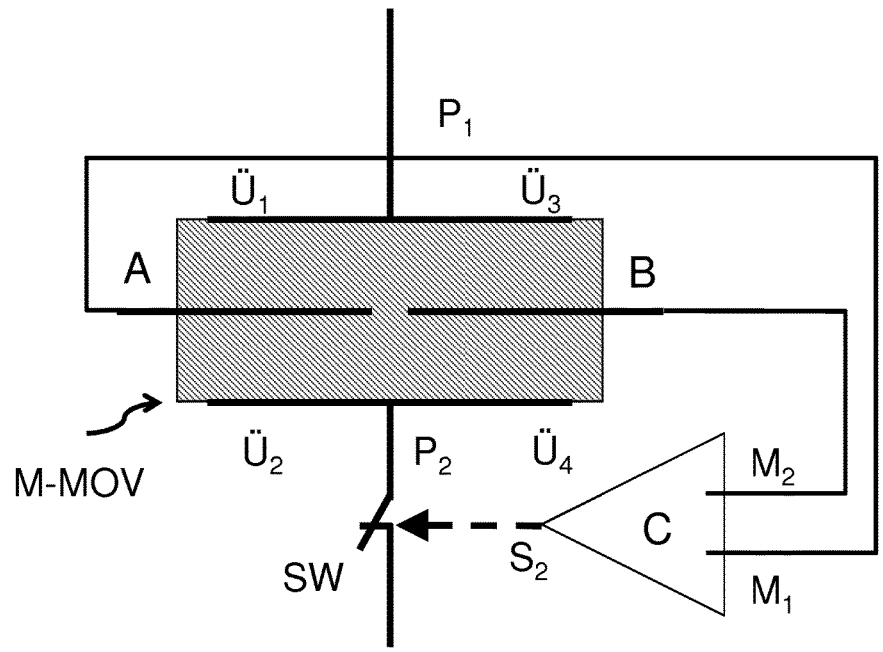
FIG. 3 shows the use of a multi-contact varistor in a circuit according to FIG. 2.
Figure 4:
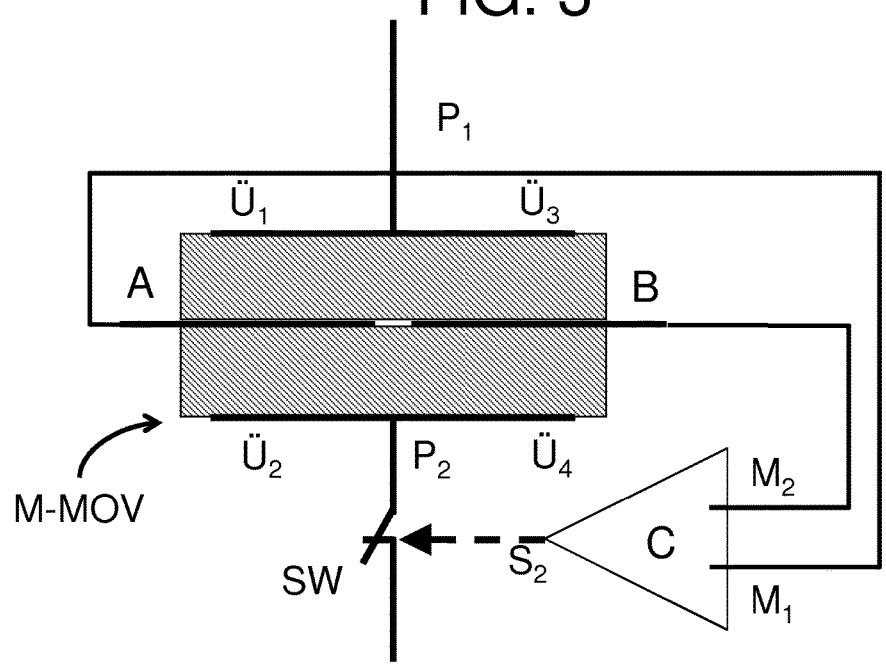
FIG. 4 shows the use of another multi-contact varistor in a circuit according to FIG. 2.

For example, the multicontact varistor M-MOV can be provided by various means, as shown in FIGS. 3 to 6. In FIG. 3, for example, two similar taps for contacting the measuring taps are provided in the ceramic of a varistor, thereby forming two (virtual) branch circuits A, B. A commensurate measure is shown using the example of a single tap for a case in which overvoltage protection devices are provided in only one branch circuit.

To enable better separation of the measuring taps in the multicontact varistor M-MOV, a provision can be made, for example, that a first varistor ceramic is arranged on another varistor ceramic, with the measuring taps $M_1$ $M_2$ being arranged between the varistor ceramics, and with the latter being additionally insulated in the interspace in order to separate the current flow into branches A and B.

Furthermore, a complete separation of the ceramics can also be provided for as shown in FIG. 5.

In an advantageous arrangement, which is shown in FIG. 7, an overvoltage protection apparatus 1 is arranged with a spark gap FS with one or more auxiliary electrodes H1, H2. The overvoltage protection apparatus 1 and the spark gap FS are connected in parallel, and the first measuring tap $M_1$ of the overvoltage protection apparatus 1 is connected to a first auxiliary ignition electrode $H_1$ of the spark gap FS.

One example of monitoring a varistor bridge in a simple manner such that, in the event of relevant damage to a varistor, the apparatus 1 is protected from destruction, is the ignition of the parallel spark gap FS, which produces a short circuit, so that an upstream fuse (not shown) is triggered and the entire overvoltage protection device is disconnected from the operating voltage. A resistively supported ignition filed by the applicant can be used to ignite the spark gaps FS, for example.

In overvoltage protection apparatuses with monitoring function according to the invention, the impedance ratio (complex resistance ratio) of the first overvoltage protection device $Ü_1$ to the second overvoltage protection device $Ü_2$ can correspond during normal operation to the impedance ratio (complex resistance ratio) of the third device $E_3$ to the fourth device $E_4$, for example. Especially simple evaluation circuits can be provided in this way. As shown in FIGS. 1, 6, and 7 for the devices E3 and E4, it can be advantageous for one or both devices E3 and E4 to be detuned so that the impedance ratios are the same during normal operation. Such a configuration can be used during production or startup, for example. Alternatively or in addition, other measures, such as a matching network, for example, can also be used.

Alternatively, a provision can of course also be made for the impedance ratios not to be identical during normal operation. Here, too, it can be achieved through appropriate wiring that only deviations from a (measured or preset) standard value are identified as a malfunction, for example. Suitable threshold switches or matching networks, for example, or even an (electronic) comparison with one or more previously-detected or previously-set values of the voltage between the first measuring tap $M_1$ and the second measuring tap $M_2$, can be used for this purpose.

Even though the elements of the invention were described above as individual elements, it will readily be understood that they can also be components of a marketable apparatus combined in a housing, for example.

The system proposed herein enables the constant, very precise monitoring of overvoltage protection components. Even slight changes can be detected and appropriate reporting and measures initiated by means of a downstream evaluation unit. First, the measuring method can be utilized to perform an actual analysis, that is, to obtain technical data; second, direct mechanisms can be set in motion by the measurement that result in the disconnection of the arrester from the power supply network, for example.

Through the constant or cyclical evaluation of the data obtained, a forecast can be made regarding the further development of the arrester. For systems that are not always accessible and the checking of which is associated with a high degree of effort (e.g., offshore wind power), such monitoring is of particular importance (Smart SPD).

Moreover, the voltage signal between the first measuring tap $M_1$ of the branch circuit A and the second measuring tap $M_2$ of the branch circuit B can also be used directly to operate actuators. This means that an actuator SW for disconnecting, short-circuiting, or bridging can be controlled simultaneously in response to the developing fault. This eliminates the time-critical detour via the detection of heating, making it possible to respond much earlier to faults.

As a result, even "rapidly" progressing damage that might lead to a short-circuit current and the associated explosion of the arrester can be caught so early that even relatively simple switching devices are sufficient to isolate the fault.

LIST OF REFERENCE SYMBOLS

Overvoltage protection apparatus with monitoring function 1
Branch circuit A, B
Overvoltage protection device $Ü_1$, $Ü_2$, $Ü_3$, $Ü_4$
Device $E_3$, $E_4$
Voltage potential $P_1$, $P_2$
Measuring tap $M_1$, $M_2$
Signal $S_1$, $S_2$
Evaluation circuit C
Shutoff device SW
Multi contact varistor M-MOV
Spark gap FS
Auxiliary ignition electrode $H_1$, $H_2$

What is claimed is:

1. An overvoltage protection apparatus with monitoring function, comprising:
    a parallel circuit comprising a first branch circuit and a second branch circuit;
    a first measuring tap; and
    a second measuring tap;
    wherein the first branch circuit has a first overvoltage protection device and a second overvoltage protection device that are connected in series,
    wherein the second branch circuit has a third device and a fourth device that are connected in series,
    wherein the first overvoltage device and the third device have a first shared voltage potential during operation,
    wherein the second overvoltage device and the fourth device have a second shared voltage potential during operation,
    wherein the first measuring tap is provided between the first overvoltage protection device and the second overvoltage protection device and wherein the second measuring tap is provided between the third device and the fourth device, and
    wherein a signal is derived from a comparison of the voltage between the first measuring tap and the second measuring tap that provides state information in relation to the first overvoltage protection device and the second overvoltage protection device.

2. The overvoltage protection apparatus as set forth in claim 1, wherein an evaluation circuit is also provided, with the evaluation circuit evaluating a differential voltage between the first measuring tap and the second measuring tap.

3. The overvoltage protection apparatus as set forth in claim 1, wherein the measurement is performed during ongoing operation.

4. The overvoltage protection apparatus as set forth in claim 1, wherein the derived signal is used as a switch signal for a shutoff device.

5. The overvoltage protection apparatus as set forth in claim 1, wherein the first overvoltage protection device and the second overvoltage protection device are selected from the group consisting of varistors and transient voltage suppressor diodes.

6. The overvoltage protection apparatus as set forth in claim 1, wherein the third device and the fourth device are overvoltage protection devices.

7. The overvoltage protection apparatus as set forth in claim 1, wherein the first overvoltage protection device and the second overvoltage protection device are subvaristors of a multicontact varistor and that the first measuring tap is a contact of the multicontact varistor.

8. The overvoltage protection apparatus as set forth in claim 1, wherein the impedance ratio of the first overvoltage protection device to the second overvoltage protection device corresponds during normal operation to the impedance ratio of the third device to the fourth device.

9. An overvoltage protection apparatus with monitoring function having a parallel circuit of two branch circuits, wherein the first branch circuit has a first overvoltage protection device and a second overvoltage protection device that are connected in series, wherein the second branch circuit has a third device and a fourth device that are connected in series, wherein the first overvoltage device and the third device have a first shared voltage potential during operation, and wherein the second overvoltage device and the fourth device have a second shared voltage potential during operation, wherein a first measuring tap is provided between the first overvoltage protection device and the second overvoltage protection device and wherein a second measuring tap is provided between the third device and the fourth device, with a signal being derived from the voltage between the first measuring tap and the second measuring tap that provides state information in relation to the first overvoltage protection device and the second overvoltage protection device, wherein a spark gap with auxiliary electrodes, wherein the overvoltage protection apparatus and the spark gap are connected in parallel and wherein the first measuring tap of the overvoltage protection apparatus is connected to a first auxiliary ignition electrode of the spark gap.

* * * * *